(12) United States Patent
Lee et al.

(10) Patent No.: US 7,457,152 B2
(45) Date of Patent: Nov. 25, 2008

(54) NON-VOLATILE MEMORY DEVICES AND SYSTEMS INCLUDING PHASE-CHANGE ONE-TIME-PROGRAMMABLE (OTP) MEMORY CELLS AND RELATED METHODS

(75) Inventors: Kwang-Jin Lee, Hwasung-si (KR); Woo-Yeong Cho, Suwon-si (KR); Du-Eung Kim, Yongin-si (KR); Beak-Hyung Cho, Hwasung-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 189 days.

(21) Appl. No.: 11/488,010

(22) Filed: Jul. 18, 2006

(65) Prior Publication Data

US 2007/0133269 A1 Jun. 14, 2007

(30) Foreign Application Priority Data

Dec. 14, 2005 (KR) .................. 10-2005-0123325

(51) Int. Cl.
*G11C 11/00* (2006.01)
(52) U.S. Cl. .............. 365/163; 365/185.04; 365/185.23
(58) Field of Classification Search .................. 365/96, 365/225.7, 185.04, 230.06, 163
See application file for complete search history.

(56) References Cited

U.S. PATENT DOCUMENTS

| | | | |
|---|---|---|---|
| 6,421,799 B1 * | 7/2002 | Ferrant | ................. 714/718 |
| 6,462,985 B2 | 10/2002 | Hosono et al. | |
| 6,480,438 B1 | 11/2002 | Park | |
| 6,487,113 B1 | 11/2002 | Park et al. | |
| 7,085,158 B2 * | 8/2006 | Jeon et al. | ............. 365/185.04 |
| 7,130,209 B2 * | 10/2006 | Reggiori et al. | ............... 365/94 |
| 2005/0177679 A1 * | 8/2005 | Alva et al. | .................. 711/104 |
| 2005/0268086 A1 * | 12/2005 | Kim | ............................. 713/2 |

FOREIGN PATENT DOCUMENTS

| | | |
|---|---|---|
| JP | 2004-152413 | 5/2004 |
| KR | 1020050008225 A | 1/2005 |
| KR | 1020050046520 A | 5/2005 |

* cited by examiner

*Primary Examiner*—Gene N. Auduong
(74) *Attorney, Agent, or Firm*—Volentine & Whitt, PLLC

(57) ABSTRACT

In one aspect, a non-volatile memory includes a phase-change memory cell array which includes a plurality of normal phase-change memory cells and a plurality of pseudo one-time-programmable (OTP) phase-change memory cells, a write driver which writes data into the normal and pseudo OTP phase-change memory cells of the phase-change memory cell array, and an OTP controller which selectively disables the write driver.

33 Claims, 13 Drawing Sheets

NON-VOLATILE MEMORY DEVICES AND SYSTEMS INCLUDING PHASE-CHANGE ONE-TIME-PROGRAMMABLE (OTP) MEMORY CELLS AND RELATED METHODS

BACKGROUND OF THE INVENTION

1. Field of the Invention

The present invention generally relates to non-volatile semiconductor memory devices, and more particularly, the present invention relates to non-volatile semiconductor memory devices which include phase-change memory cells.

A claim of priority is made to Korean Patent Application No. 10-2005-0123325, filed Dec. 14, 2005, in the Korean Intellectual Property Office, the entirety of which is incorporated herein by reference.

2. Description of the Related Art

A phase-change random access memory (PRAM), also known as an Ovonic Unified Memory (OUM), includes a phase-change material such as a chalcogenide alloy which is responsive to energy (e.g., thermal energy) so as to be stably transformed between crystalline and amorphous states. Such a PRAM is disclosed, for example, in U.S. Pat. Nos. 6,487,113 and 6,480,438.

The phase-change material of the PRAM exhibits a relatively low resistance in its crystalline state, and a relatively high resistance in its amorphous state. In conventional nomenclature, the low-resistance crystalline state is referred to as a 'set' state and is designated logic "0", while the high-resistance amorphous state is referred to as a 'reset' state and is designated logic "1".

The terms "crystalline" and "amorphous" are relative terms in the context of phase-change materials. That is, when a phase-change memory cell is said to be in its crystalline state, one skilled in the art will understand that the phase-change material of the cell has a more well-ordered crystalline structure when compared to its amorphous state. A phase-change memory cell in its crystalline state need not be fully crystalline, and a phase-change memory cell in its amorphous state need not be fully amorphous.

Generally, the phase-change material of a PRAM is reset to an amorphous state by joule heating of the material in excess of its melting point temperature for a relatively short period of time. On the other hand, the phase-change material is set to a crystalline state by heating the material below its melting point temperature for a longer period of time. In each case, the material is allowed to cool to its original temperature after the heat treatment. Generally, however, the cooling occurs much more rapidly when the phase-change material is reset to its amorphous state.

The speed and stability of the phase-change characteristics of the phase-change material are critical to the performance characteristics of the PRAM. As suggested above, chalcogenide alloys have been found to have suitable phase-change characteristics, and in particular, a compound including germanium (Ge), antimony (Sb) and tellurium (Te) (e.g., $Ge_2Sb_2Te_5$ or GST) exhibits a stable and high speed transformation between amorphous and crystalline states.

FIGS. 1A and 1B illustrate a memory cell 10 in a 'set' state and in a 'reset' state, respectively. In this example, the memory cell 10 includes a phase-change resistive element 11 and a transistor 20 connected in series between a bit line BL and a reference potential (e.g., ground), with the transistor 20 being gated to a word line WL. It should be noted that FIGS. 1A and 1B are general schematic views only, that the configuration of the phase-change resistive element 11 is presented as an example only, and that other configurations and connections with respect to the phase-change resistive element 11 are possible. As an example of one variation, the phase-change resistive element 11 may instead be connected in series with a diode between the bit line BL and the word line WL.

In each of FIGS. 1A and 1B, the phase-change resistive element 11 includes a top electrode 12 formed on a phase-change material 14. In this example, the top electrode 12 is electrically connected to a bit line BL of a PRAM memory array (not shown). A conductive bottom electrode contact (BEC) 16 is formed between the phase-change material 14 and a conductive bottom electrode 18. The access transistor 20 is electrically connected between the bottom electrode 18 and the reference potential. As already suggested, the gate of the access transistor 20 is electrically connected to the word line WL of the PRAM cell array (not shown).

In FIG. 1A, the phase-change material 14 is illustrated as being in its crystalline state. As described previously, this means that the memory cell 10 is in a low-resistance 'set' state or logic 0 state. In FIG. 1B, a portion of the phase-change material 14 is illustrated as being amorphous. Again, this means that the memory cell 10 is in a high-resistance 'reset' state or logic 1 state.

The set and reset states of the memory cell 10 of FIGS. 1A and 1B are established by controlling the magnitude and duration of current flow through the BEC 16. That is, the phase-change resistive element 11 is activated (or accessed) by operation of the access transistor 20 which is responsive to a voltage of the word line WL. When activated, the memory cell 10 is programmed according to the voltage of the bit line BL. The bit line BL voltage is controlled to establish a programming current ICELL which causes the BEC 16 to act as a resistive heater which selectively programs the phase-change material 14 in its 'set' and 'reset' states.

FIG. 2 illustrates an example of temperature pulse characteristics of the phase-change material as the phase-change material is programmed in the 'set' and 'reset' states. In particular, reference number 35 denotes the temperature pulse of the phase-change material programmed to its 'reset' state, and reference number 36 denotes the temperature pulse of the phase-change material programmed to its 'set' state.

As shown in FIG. 2, when the phase-change material is programmed to its 'reset' state, the temperature of the material is increased above its melting temperature Tm (e.g., 610° C.) for a relatively short period of time, and then allowed to rapidly cool. In contrast, when the phase-change material is programmed to its 'set' state, the temperature of the material is increased to below its melting point Tm and above its crystallizing temperature Tx (e.g., 450° C.) for a longer period of time, and then allowed to cool more slowly. The fast and slow cooling of the 'reset' and 'set' programming operations are referred to in the art as fast "quenching" and slow "quenching", respectively. The temperature range between the melting temperature Tm and the crystallizing temperature Tx is referred to as the "set window".

FIG. 3 is a graph illustrating the resistive characteristic (current versus voltage) of a phase-change material for each of its 'set' and 'reset' states. In particular, line 46 is representative of the resistive characteristic of a phase-change material in its 'set' state, and line 45 is representative of the same in its 'reset' state. As shown, the set and reset resistances differ substantially below a threshold voltage (e.g., 1 v), but become substantially equal to one another above the threshold voltage. Thus, in order to maintain the necessary sensing margin during reading operations, it is necessary to restrict the bit line BL voltage to a region below the voltage threshold.

As explained below with reference to FIG. 4, a clamping transistor inserted in the bit line BL may be used for this purpose.

FIG. 4 is a simplified circuit diagram for explaining write and read operations of the phase-change memory cell. As shown, a bit line BL is coupled to a write driver 24 and a read circuit 26. Also connected to the bit line BL are a phase-change memory cell 10, a pre-charge transistor 20, and a select transistor 22.

In this example, the phase-change memory cell 10 includes a phase-change element and transistor connected in series between the bit line BL and a reference potential (e.g., ground), where the transistor is gated to a word line WL. As suggested previously, other configurations of the phase-change memory cell 10 are possible. For example, the phase-change memory cell 10 may instead include a phase-change memory element and diode connected between the bit line BL and word line WL.

As those skilled in the art will appreciate, the precharge transistor 20 (gated to a precharge control signal PREBL) is used to precharge the bit line BL in a read and/or write operation, while the select transistor 22 (gated to a y-address signal YSEL) is used to activate the bit line BL.

The write driver 24 typically includes a current mirror 28 for applying either a reset current RESET or a set current SET as a write current $i_{write}$ to the bit line BL during a write operation. The reset current RESET and the set current SET were discussed previously in connection with FIG. 2.

The read circuit 26 is functional in a read operation to apply a read current $i_{read}$ from a current source READ to the bit line BL. A clamping transistor 30, which is gated to a clamp control signal $V_{CLAMP}$, restricts the bit line BL voltage to a region below the voltage threshold as discussed above in connection with FIG. 3. A sense-amplifier S/A compares the voltage of the bit line BL with a reference voltage $V_{REF}$, and outputs the comparison result as output data OUT.

In the meantime, non-volatile one-time-programmable (OTP) memory cells are typically used to store various types of security information in both volatile and non-volatile semiconductor memory devices, such as DRAM, SRAM and Flash memory devices. Examples of security information typically stored in OTP memory cells include device serial number, manufacturer indicia, date of manufacture, and so on. Generally, OTP memory cells are characterized by being capable of a single programming operation, i.e., they can not be reprogrammed after initial programming.

SUMMARY OF THE INVENTION

According to an aspect of the present invention, a non-volatile memory is provided which includes a phase-change memory cell array which includes a plurality of normal phase-change memory cells and a plurality of pseudo one-time-programmable (OTP) phase-change memory cells, a write driver which writes data into the normal and pseudo OTP phase-change memory cells of the phase-change memory cell array, and an OTP controller which selectively disables the write driver.

According to another aspect of the present invention, a non-volatile memory is provided which includes a memory cell array comprising a plurality of normal phase-change memory cells operatively coupled to at least one first word line and a plurality of pseudo one-time-programmable (OTP) phase-change memory cells operatively coupled to at least one second word line, a write driver which programs the normal and pseudo OTP phase-change memory cells of the memory cell array, an OTP mode controller which generates an OTP mode signal, and an address decoder which selectively activates the at least one first word line in accordance with an address signal, and which selectively activates the at least one second word line in response to the OTP mode signal.

According to yet another aspect of the present invention, a phase-change memory cell device is provided which is operable in a one-time-programmable (OTP) mode, and which includes a phase-change cell write driver, and a control circuit that selectively disables the phase-change cell write driver during the OTP mode.

According to still another aspect of the present invention, a system is provided which includes a microprocessor connected to a non-volatile memory device. The non-volatile memory includes a phase-change memory cell array which includes a plurality of normal phase-change memory cells and a plurality of pseudo one-time-programmable (OTP) phase-change memory cells, a write driver which writes data into the normal and pseudo OTP phase-change memory cells of the phase-change memory cell array, and an OTP controller which selectively disables the write driver.

According to yet another aspect of the present invention, a method of operating a non-volatile semiconductor memory in a one-time-programmable (OTP) mode of operation is provided which includes accessing pseudo OTP phase-change memory cells, and selectively disabling and enabling programming of the accessed pseudo OTP phase-change memory cells according to a pre-stored OTP control signal.

BRIEF DESCRIPTION OF THE DRAWINGS

The above and other aspects and features of the invention will become readily apparent from the detailed description that follows, with reference to the accompanying drawings, in which.

DETAILED DESCRIPTION OF PREFERRED EMBODIMENTS

As explained previously, OTP memory cells are utilized to store security information and are characterized by being capable of a single programming operation, i.e., they can not be reprogrammed after initial programming. However, this lack of reprogramming capability can be disadvantageous in that it limits the ability to change the security information after storage in the OTP memory cells. As explained below, embodiments of the present invention are directed to phase-change random access memories (PRAMs) and related methods in which security information is stored in pseudo-OTP phase-change memory cells. The phase-change memory cells are deemed to be "pseudo" OTP memory cells since they can be reprogrammed after an initial programming operation. Thus, while the security information can be safely stored in the pseudo-OTP memory cells, the security information can also be changed if necessary after initial programming.

A non-volatile memory device according to a non-limiting embodiment of the present invention will now be described with reference to FIG. 5.

Figure 1A:
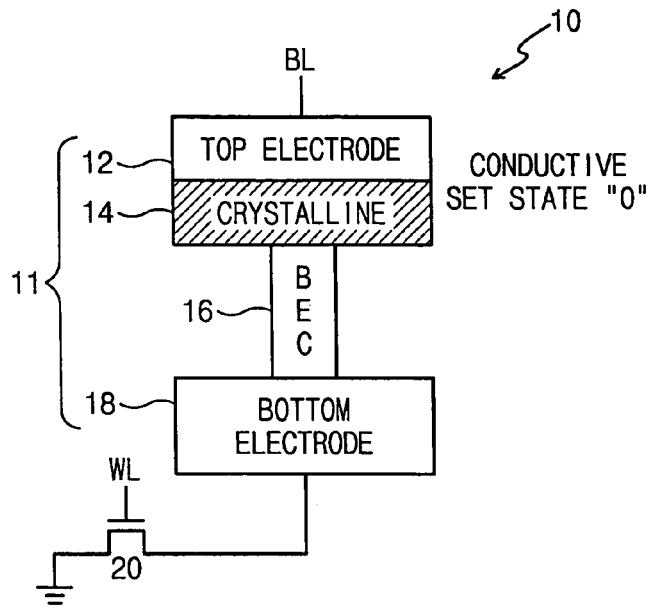
FIGS. 1A and 1B are schematic views of a phase-change memory cell in a set state and a reset state, respectively.
Figure 1B:
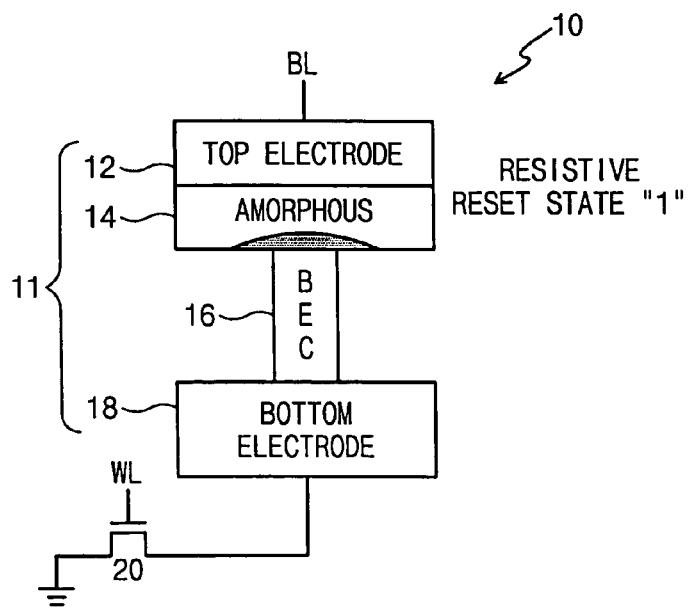
Figure 2:
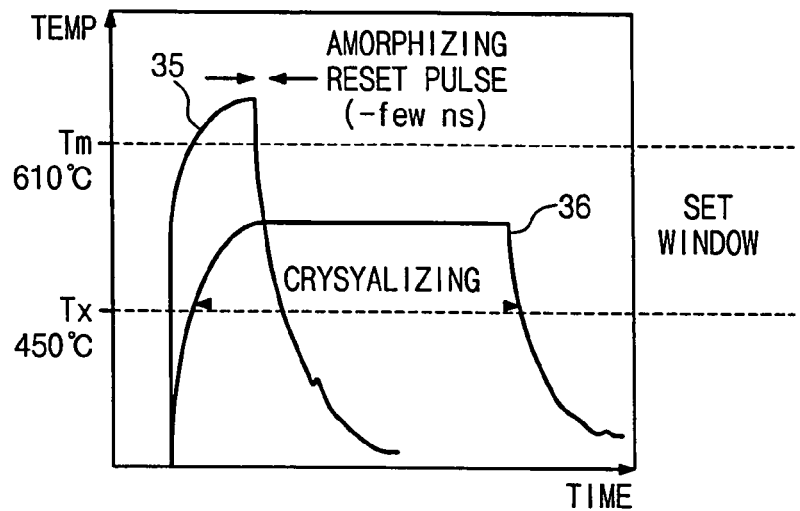
FIG. 2 is a graph showing temperature characteristics during programming of a phase-change memory cell.
Figure 3:
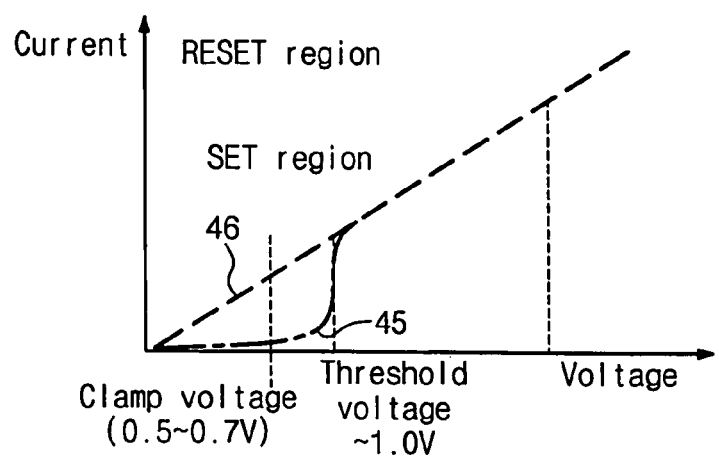
FIG. 3 is graph showing resistive characteristics of a phase-change memory cell.
Figure 4:
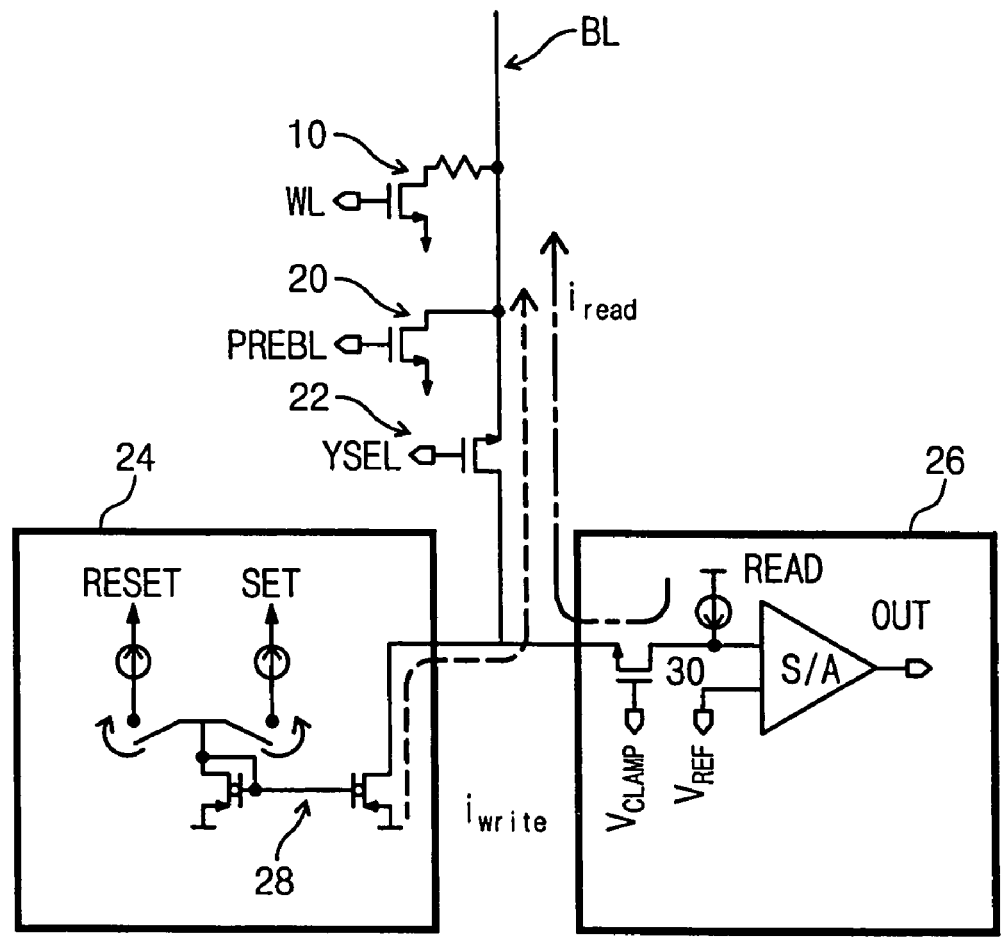
FIG. 4 is a circuit diagram of write and read circuits of a phase-change memory cell.
Figure 5:
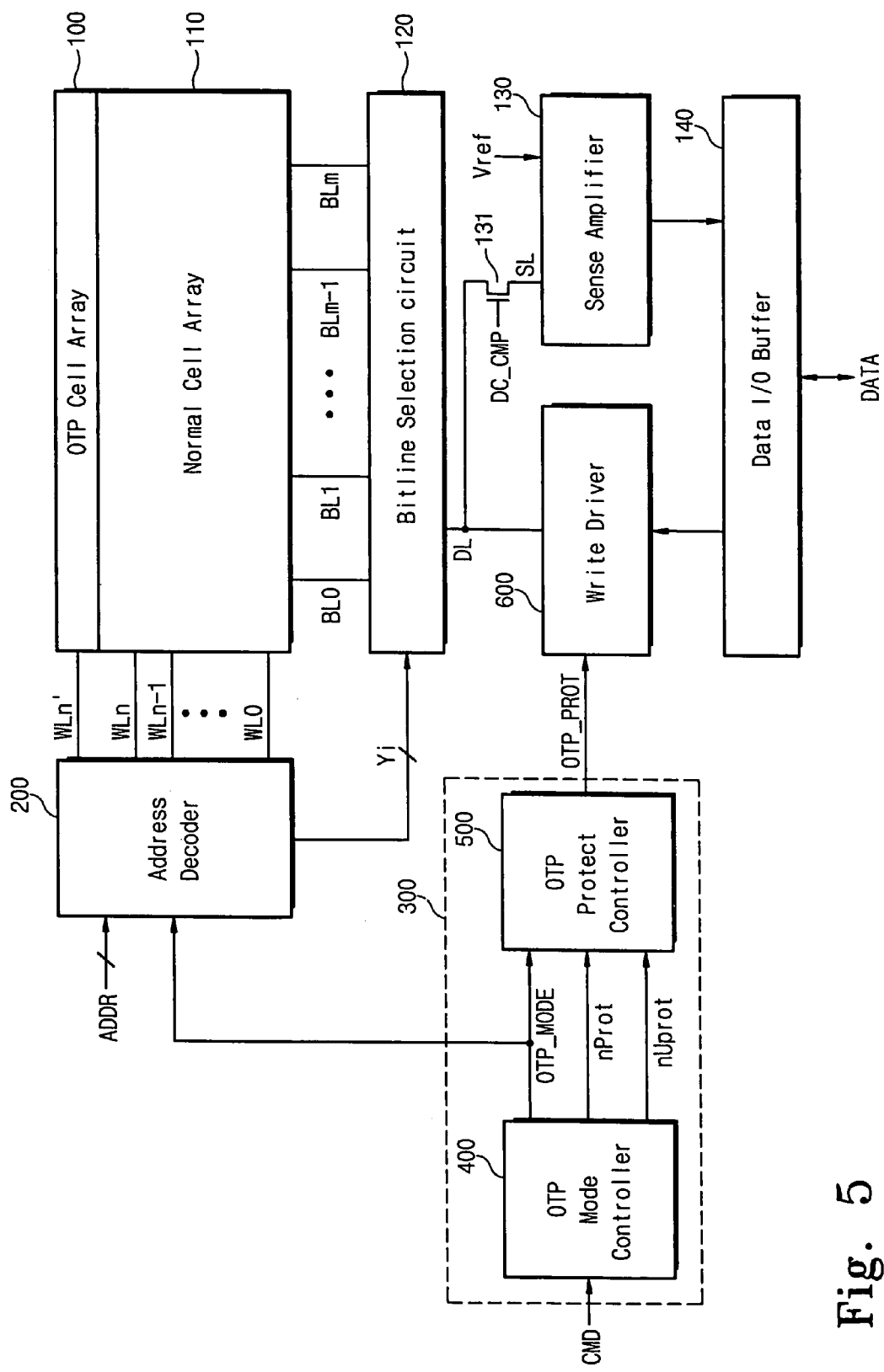
FIG. 5 is a block diagram of a non-volatile memory device according to an embodiment of the present invention.

Referring to FIG. 5, the non-volatile memory device of this example includes a pseudo-OTP cell array 100, a normal cell array 110, a bit line selection circuit 120, a sense amplifier 130, a data input-output (I/O) buffer 140, an address decoder 200, and an OTP controller 300.

The normal cell array 110 includes an array of "normal" phase-change memory cells connected to corresponding word lines WL<0:n> and bit lines BL<0:m> (where m and n are positive integers). The word "normal" has no structural connotation, and instead is used here simply to distinguish these memory cells from the memory cells contained in the pseudo-OTP cell array 100 (discussed below). In fact, the memory cells of the normal memory array 110 and the OTP memory cells of the pseudo-OTP memory array 100 may be structurally identical.

For example, each normal memory cell may include a phase-change element connected to a corresponding bit line and a selection element connected to a corresponding word line. The phase-change element may include, for example, a phase-change material of Ge, Sb and Te (GST). The selection element may include, for example, either a diode or a MOS transistor. In the case of where the selection element is a diode, the phase-change element and the diode may be connected in series between the corresponding bit and word lines. In the case where the selection element is a MOS transistor (e.g., an n-type MOS transistor), the phase-change element and the MOS transistor may be connected in series between a corresponding bit line and a reference potential (e.g., ground), and a gate of the MOS transistor may be connected to a corresponding word line.

The pseudo OTP cell array 100 includes an array of OTP phase-change memory cells connected to one or more corresponding word lines WLn' and to the corresponding bit lines BL<0:m>. As with the normal cell array 110, each OTP memory cell of the pseudo OTP cell array may include a phase-change element connected to a corresponding bit line and a selection element connected to a corresponding word line. Again, the phase-change element may include, for example, a phase-change material of Ge, Sb and Te (GST), and the selection element may include, for example, either a diode or a MOS transistor.

As will be readily apparent to those in the art, the pseudo-OTP cell array 100 and the normal cell array 110 may be considered as a single phase-change memory cell array in which the memory cells connected to word lines WL<0:n> are designated normal phase-change memory cells, and the memory cells connected to the word line WLn' are designated as pseudo-OTP phase-change memory cells.

Still referring to FIG. 5, the address decoder 200 selects one of the word lines WL<0:7> and WLn' according to an address signal ADDR and an OTP mode control signal OTP_MODE, and supplies a y-address signal Yi of the address signal ADDR to the bit line selection circuit 120. The word line selection function of the address decoder 200 will be explained in more detail late with reference to FIG. 6.

The bit line selection circuit 120 is responsive to the y-address signal Yi to select the bit lines BL<0:m> for connection to a data line DL. Typically, but not necessarily, the bit line selection circuit 120 is constructed of a plurality of MOS transistors (not shown) respectively connected in series between a corresponding bit line BL<0:m> and the date line DL. The gates of the MOS transistors are selectively activated by the y-address signal, thus selectively connecting the bit lines BL<0:m> to a data line DL.

The data line DL is connected to the write driver 600, and to the sense amplifier 130 through the clamping circuit 131. The write driver 600 and the sense amplifier 130 may be constructed in a conventional manner, and those of ordinary skill are well acquainted with these circuits and their functionality. However, in the embodiments described herein, the write driver 600 is disabled in response to the OTP protection signal OTP_PROT. This functionality may be implemented as desired. As one example, a PMOS transistor may be inserted in the output current path of the write driver 600, where the PMOS transistor is gated to receive the OTP protection signal OTP_PROT. The output current path of the write driver 600 is thereby blocked when the OTP protection signal OTP_PROT is HIGH.

The data I/O buffer 140 supplies data to be written to the write driver 600, and receives data that is read from the sense amplifier 130. The internal configuration of the data I/O buffer is well known to those skilled in the art, and accordingly, a detailed description thereof is omitted here.

The OTP controller 300 is responsive to a command signal CMD, and is configured to supply the OTP mode signal OTP_MODE to the address decoder 200 and to supply the OTP protection signal OTP_PROT to the write driver 600. In the example of this embodiment, the OTP controller includes an OTP mode controller 400 and an OTP protect controller 500.

In the present embodiment, the OTP protect controller 500 includes a memory element which dictates whether the OTP protection signal OTP_PROT is active (and thus, the write driver is disabled) when the OTP mode signal OTP_MODE is active (and thus, the word line WLn' is enabled as explained below in connection with FIG. 6). The logic value stored in the memory element of the OTP protect controller 500 is referred to herein as the "OTP controller setting." In the example of this embodiment, and a shown in TABLE 1 below, the OPT controller setting is either "OTP Protect" or "OTP Unprotect."

TABLE 1

| | Operational Mode | | |
| --- | --- | --- | --- |
| | Normal Mode | OTP Mode | |
| OTP Controller Setting | n/a | OTP Protect | OTP Unprotect |
| OTP_MODE Signal | LOW | HIGH | HIGH |
| OTP_PROT Signal | LOW | HIGH | LOW |
| Word Line WLn' | Disabled | Enabled | Enabled |
| Write Driver | Enabled | Disabled | Enabled |
| Sense Amplifier | Enabled | Enabled | Enabled |

In a normal operational mode (i.e., a non-OTP mode), the OPT_MODE signal is LOW and thus the word line WLn' is not enabled. Also, regardless of the logic value of the storage element of the OPT protect controller 500 (i.e., regardless of the OTP controller setting), the OTP_PROT signal is LOW, and thus the write driver 600 is enabled. Also, the sense amplifier is enabled in the normal operational mode.

The OTP mode occurs when the OTP_MODE signal is HIGH (and thus the word line WLn' is enabled). In addition, the ability to write data into the pseudo-OTP cell array 100 depends on whether the OTP controller setting is set to "OTP Protect" or "OTP Unprotect".

More particularly, in this example, when the OTP controller setting is set to "OTP Protect", the OTP_PROT signal is HIGH which causes the write driver 600 to be disabled. Thus, writing data into the pseudo-OTP cell array 100 is prevented.

On the other hand, when the OTP Controller Setting is set to "OTP Unprotect", the OTP_PROT signal is LOW and the write driver 600 remains enabled. This allows for the writing of new security data into the pseudo-OTP cell array 100.

Figure 6:
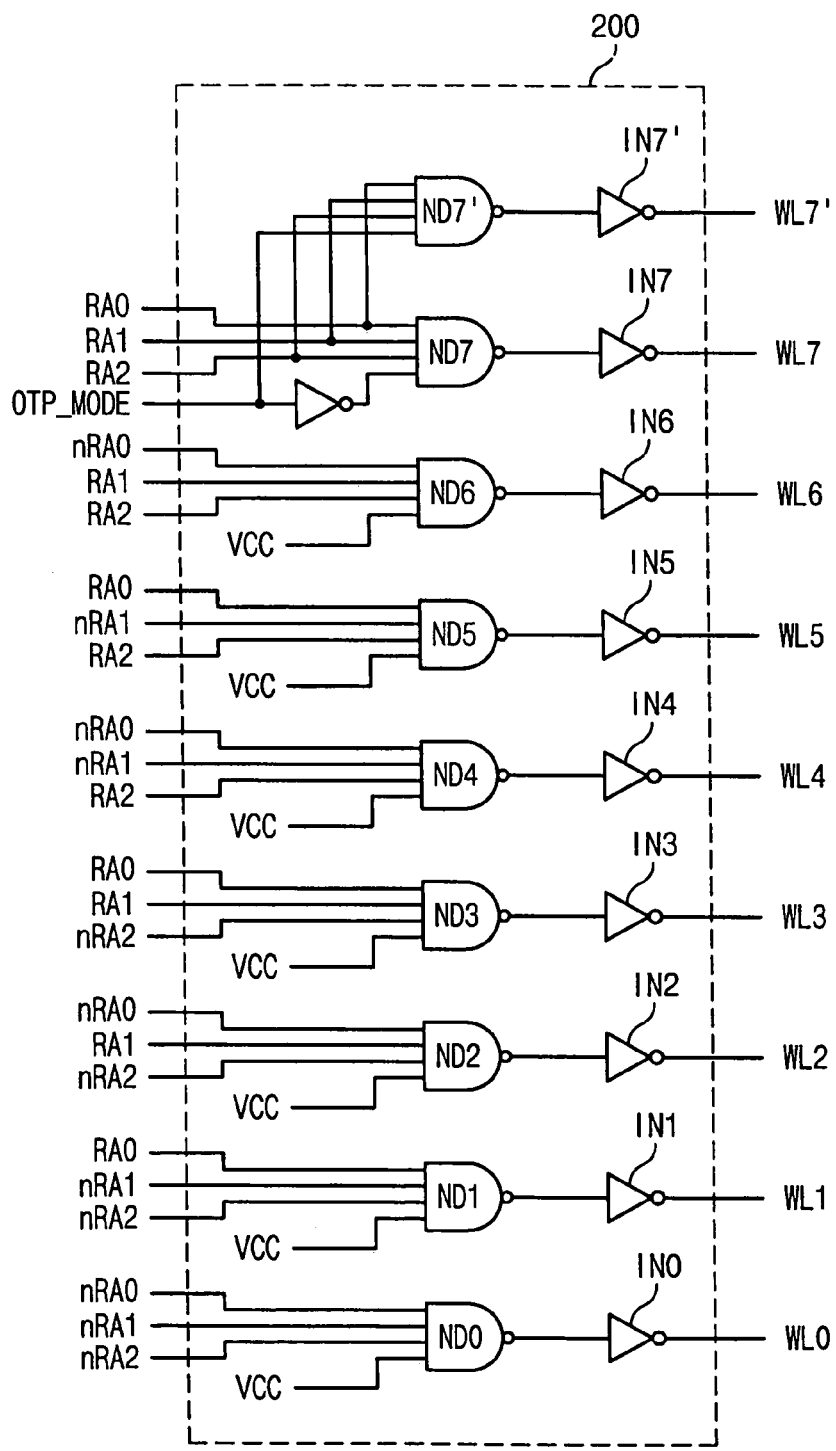
FIG. 6 is a circuit diagram of an address decoder according to an embodiment of the present invention.

An example of the address decoder 200 (excluding the y-address circuitry) is illustrated in FIG. 6. In the example of FIG. 6, it is assumed that the normal memory cell array 110 includes eight word lines WL<0:7>, and the pseudo-OTP memory cell array 100 includes one word line WLn'. In this case, the address ADDR includes address bits RA<0:2> which identify one of the eight word lines WL<0:7>. As shown in FIG. 6, the address bits RA<0:2> are selectively applied to four-input NAND gates ND<0:7> and NDn' having outputs respectively connected to inverters IN<0:7> and INn'.

One input of each of the NAND gates ND<0:6> is fixed to a HIGH level by connection to a reference potential (e.g., VCC). The remaining inputs of the NAND gates ND<0:6> receive the address bits RA<0:2> as shown in FIG. 6. (In FIG. 6, "n" denotes an inverted bit.) When all inputs to any one of the NAND gates ND<0:6> are HIGH, a corresponding word line WL<0:6> is "selected" (HIGH).

On the other hand, still referring to FIG. 6, one input of the NAND gate ND7 is connected to an inverted OTP mode signal OTP_MODE, and one input of the NAND gate ND7' is connected to the OTP mode signal OTP_MODE. As such, when the OTP mode signal OTP_MODE is LOW, the NAND gate ND7 is enabled, and when the OTP mode signal OTP_MODE is HIGH, the NAND gate ND7' is enabled. That is, the word line WL7 is selected when the address bits RA<0:2> are all HIGH and the OTP mode signal OTP_MODE is LOW. On the other hand, the word line WL7' is selected when the address bits RA<0:2> are all HIGH and the OTP mode signal OTP_MODE is HIGH.

An example of the OTP protect controller 500 will now be described with reference to FIG. 7. As illustrated, the OTP protect controller 500 of FIG. 7 includes a signal controller 510, a storage portion 520, a sensing portion 530, and a latch portion 540.

The signal controller 510 receives the OTP_MODE signal and nProt and nUprot signals from the OTP mode controller 400 (FIG. 5). As will be explained below, the nProt and nUprot signals are utilized during writing of the storage element of the OTP protect controller 500 (i.e., to set the OTP Controller Setting). The signal controller 510 is responsive to the OTP_MODE signal and the nProt and nUprot signals to generate various controls signals SET, RST, WLT, WLC, PCHG, PDIS, nPSA, PMUX and CLMP. Each of these control signals is discussed later herein.

The storage portion 520 constitutes an example of the storage element of the OTP protect controller 500 in which a logic value indicative of the previously described OTP controller setting ("OTP Protect" or "OTP Unprotect") is stored. In the example of this embodiment, the logic value is stored in complimentary phase-change memory cells 521T and 521C. As shown, the phase-change memory cell 521T includes a phase-change element GST and an NMOS transistor MT gated to a word line WLT. Likewise, the phase-change memory cell 521C also includes a phase-change element GST and an NMOS transistor MT gated to a word line WLC. Complimentary phase-change memory cells are utilized in this embodiment in order to enhance the sensing margin during a read operation. However, the invention is not limited in this respect, and a single memory cell may be utilized instead. Further, the access element of the phase-change cell or cells may be implemented by a diode instead of a transistor. Still further, the memory cell or cells may be implemented by other types of non-volatile memory cells.

TABLE 2 that follows illustrates the relationship between the setting of the OTP protect controller 500 and the states of the memory cells 521T and 521C in the example of this embodiment.

TABLE 2

|  | OTP Controller Setting | |
| --- | --- | --- |
|  | OTP Unprotect | OTP Protect |
| Memory Cell 521T | SET ("0") | RESET ("1") |
| Memory Cell 521C | RESET ("1") | SET ("0") |

In order to set the OTP Controller Settings of TABLE 2, the storage portion 520 includes write circuits 522T and 522C respectively connected to the phase-change memory cells 521T and 522C. In the example of this embodiment, the write circuits 522T and 522C have simplified structures in which each is comprised of four PMOS transistors P21-P24 and P25-28, respectively. As shown in FIG. 7, a reset pulse RST is applied to the gates of PMOS transistors P23 and P28, and a set pulse SET is applied to the gates of PMOS transistors. As one skilled in the art will appreciate, the sizes of the PMOS transistors P24 and P27 may differ from the sizes of the PMOS transistors P23 and P28 in order to obtain set and result current pulses of appropriately different magnitudes.

The OTP mode controller 400 supplies the nProt and nUprot write signals in order to program the OTP controller setting of the phase-change memory cells 521C and 521T. TABLE 3 below illustrates the relationship between the nProt and nUprot write signals and the OTP operations of the OTP controller 300.

TABLE 3

|  | OTP Operation | | |
| --- | --- | --- | --- |
|  | Write OTP Protect | Write OTP Unprotect | Read OTP |
| nProt signal | LOW | HIGH | HIGH |
| nUprot signal | HIGH | LOW | HIGH |
| 522T RESET signal | Reset pulse | n/a | HIGH |
| 522C SET signal | Set pulse | n/a | HIGH |
| 522T SET signal | n/a | Set pulse | HIGH |
| 522C RESET signal | n/a | Reset pulse | HIGH |

Figure 7:
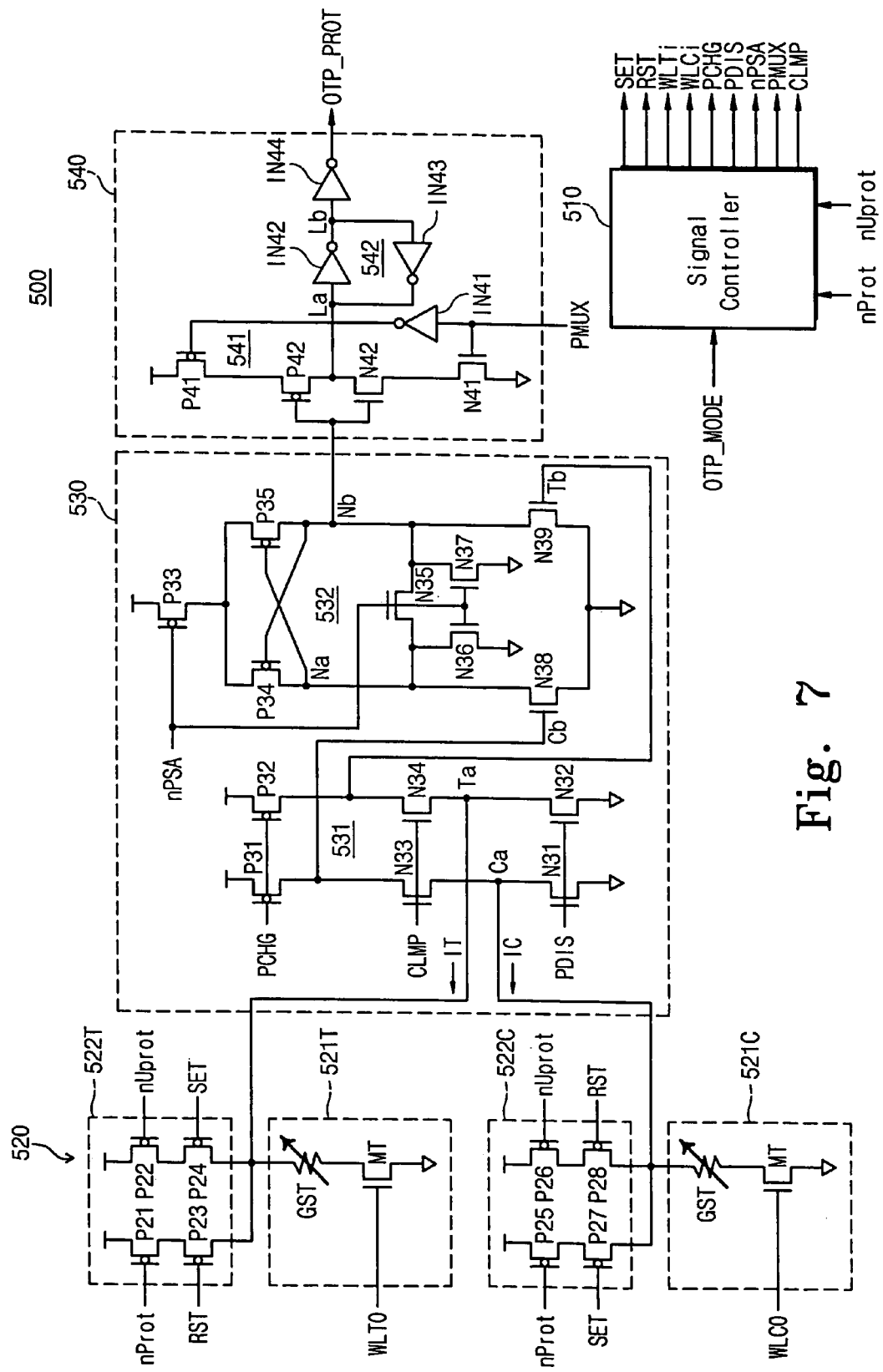
FIG. 7 is a circuit diagram of an OTP protect controller according to an embodiment of the present invention.

Referring to FIG. 7, in order to program the OTP controller setting to OTP Protect, the nProt write signal is LOW to thereby turn on the PMOS transistors P21 and P25, and the nUprot write signal is HIGH to thereby turn off the PMOS transistors P22 and P26. In the meantime, a reset pulse RST is applied to PMOS transistors P23 and P28, and a set pulse SET is applied to PMOS transistors P24 and P27. However, since the PMOS transistors P22 and P26 are turned off, only a write current corresponding to the reset pulse RST is applied to the memory cell 521T, and only a write current corresponding to the set pulse SET is applied to the memory cell 521C. In this manner, the OTP controller setting is programmed to OTP Protect (see TABLE 2).

In order to program the OTP controller setting to OTP Unprotect, the nProt write signal is HIGH to thereby turn off the PMOS transistors P21 and P25, and the nUprot write signal is LOW to thereby turn on the PMOS transistors P22 and P26. Also, a reset pulse RST is applied to PMOS transistors P23 and P28, and a set pulse SET is applied to PMOS transistors P24 and P27. Since the PMOS transistors P21 and P25 are turned off, only a write current corresponding to the set pulse SET is applied to the memory cell 521T, and only a write current corresponding to the reset pulse RST is applied to the memory cell 521C. In this manner, the OTP controller setting is programmed to OTP Unprotect (see TABLE).

As illustrated in TABLE 3, during a read operation (i.e., when reading the OTP controller setting to enable or disable the write driver), all of the PMOS transistors P21-P28 are preferably placed in an off state in order to minimize leakage to sense nodes Ta and Ca (discussed below) during a sensing operation.

Still referring to FIG. 7, the sensing portion 530 includes the sense nodes Ta and Ca respectively connected to the memory cells 521T and 521C. As shown the figure, PMOS transistors P31 and P32 are gated to receive a pre-charge signal PCHG, NMOS transistors N33 and N34 are gated to receive a clamping signal CLMP, and NMOS transistors N31 and N32 are gated to receive pre-discharge signal PDIS.

Nodes Cb and Tb are respectively defined between the transistors P31 and N33, and between the transistors P32 and N34.

PMOS transistors P33-P35 and NMOS transistors N35-N38 are connected as shown in FIG. 7 and essentially function in a well-known manner as a comparator circuit for comparing the voltages at nodes Cb and Tb. The comparison result appears as a voltage at node Nb. Note that the sensing portion 530 is disabled when the sense amplification signal nPSA is HIGH.

The latch portion 540 of this example includes an inverter circuit and a latch circuit. As shown in FIG. 7, the inverter circuit is connected to node Nb of the sensing portion 530, and includes PMOS transistors P41 and P42, PMOS transistors N41 and N42, and inverter IN41. The latch circuit includes inverters IN42 through IN44, with the output of the inverter IN44 constituting the OTP_PROT signal (which is applied to the write driver 600 in FIG. 5). The control signal PMUX is applied to the input of the inverter IN1 and to the gate of transistor N41. As such, the latch portion 540 is enabled when the control signal PMUX is HIGH.

In the example of FIG. 7, the storage portion 520, the sensing portion 530 and the latch portion 540 are all driven by a supply voltage (e.g., VCC). However, it is possible to utilize other drive voltages (e.g., a boosted voltage VPP) for one or more of these circuits.

By utilizing complimentary phase-change memory cells 521T and 521C in the storage portion 520, it possible to drive the write circuits 522T and 522C with a non-boosted supply voltage (e.g., VCC). In contrast, the write driver 600 may preferably, but not necessarily, be driven by a boosted supply voltage (e.g., VPP).

The operation of the OTP protect controller 500 shown in FIG. 7 will now be described with reference to the timing diagrams of FIGS. 8-11.

Figure 8:
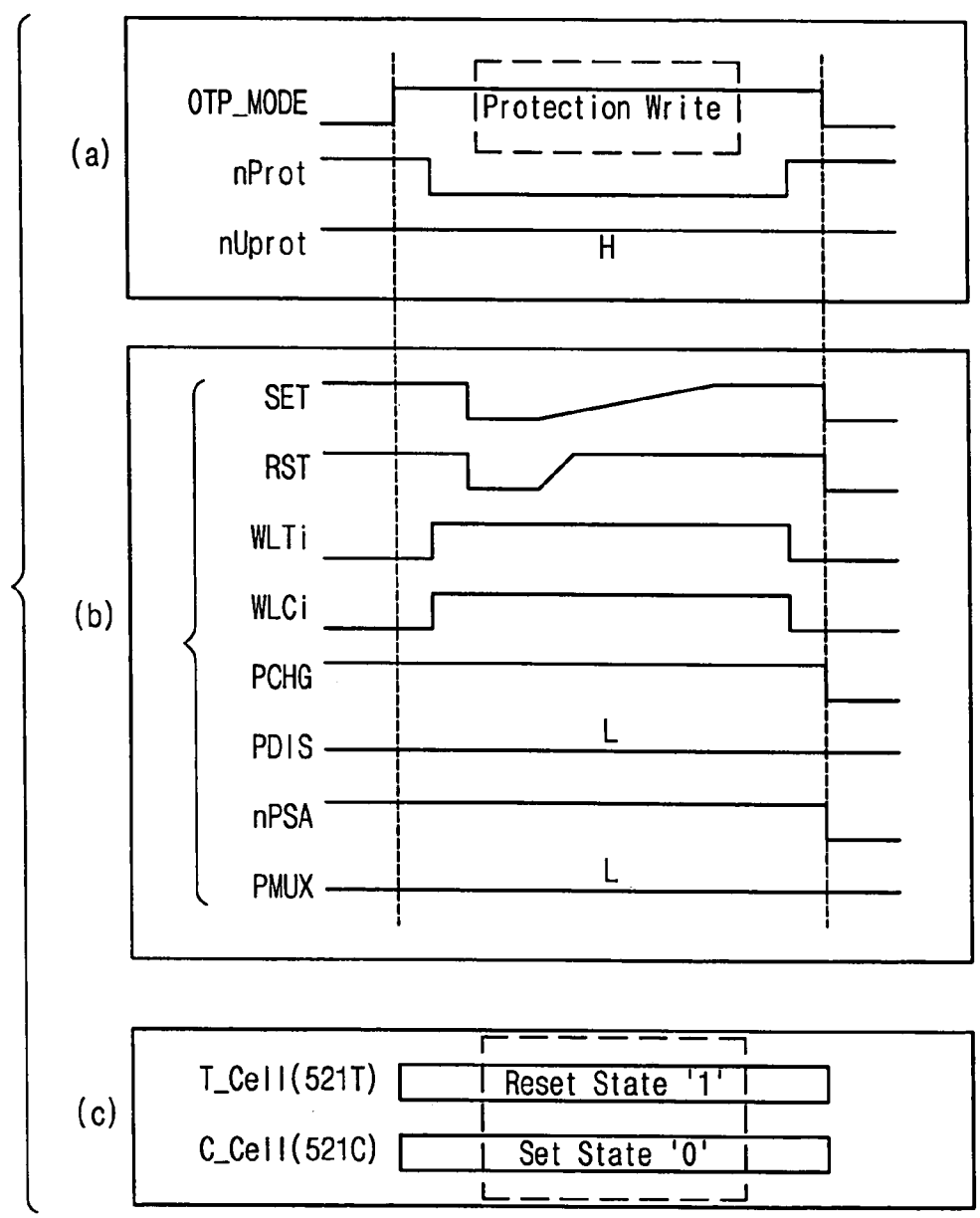
FIGS. 8 through 11 are timing diagrams for use in explaining OTP read and write operations of a non-volatile memory device according to embodiments of the present invention.

FIG. 8 is a timing diagram for explaining the programming (writing) of the OTP controller setting to OTP Protect. As described previously in connection with TABLE 2, this means that the memory cell 521T is programmed to a RESET state, and the memory cell 521C is programmed to a SET state. Initially, the nProt write signal is driven LOW, while the nUprot write signal remains HIGH. As such, transistors P21 and P25 are turned on, and transistor P22 and P26 remain off. Also, word lines WLT and WLC are activated to HIGH, thus turning on the two memory cell transistors MT. The RESET and SET pulses are then applied to the gates of the transistors P23 and P27 to thereby program the memory cells 512T and 512C to the RESET and SET states, respectively. Also, during this OTP protect write operation, the control signals PCHG and nPSA are HIGH, and the control signals PDIS and PMUX are LOW. Thus, the sensing portion 530 and the latch portion 540 are effectively disabled.

Figure 9:
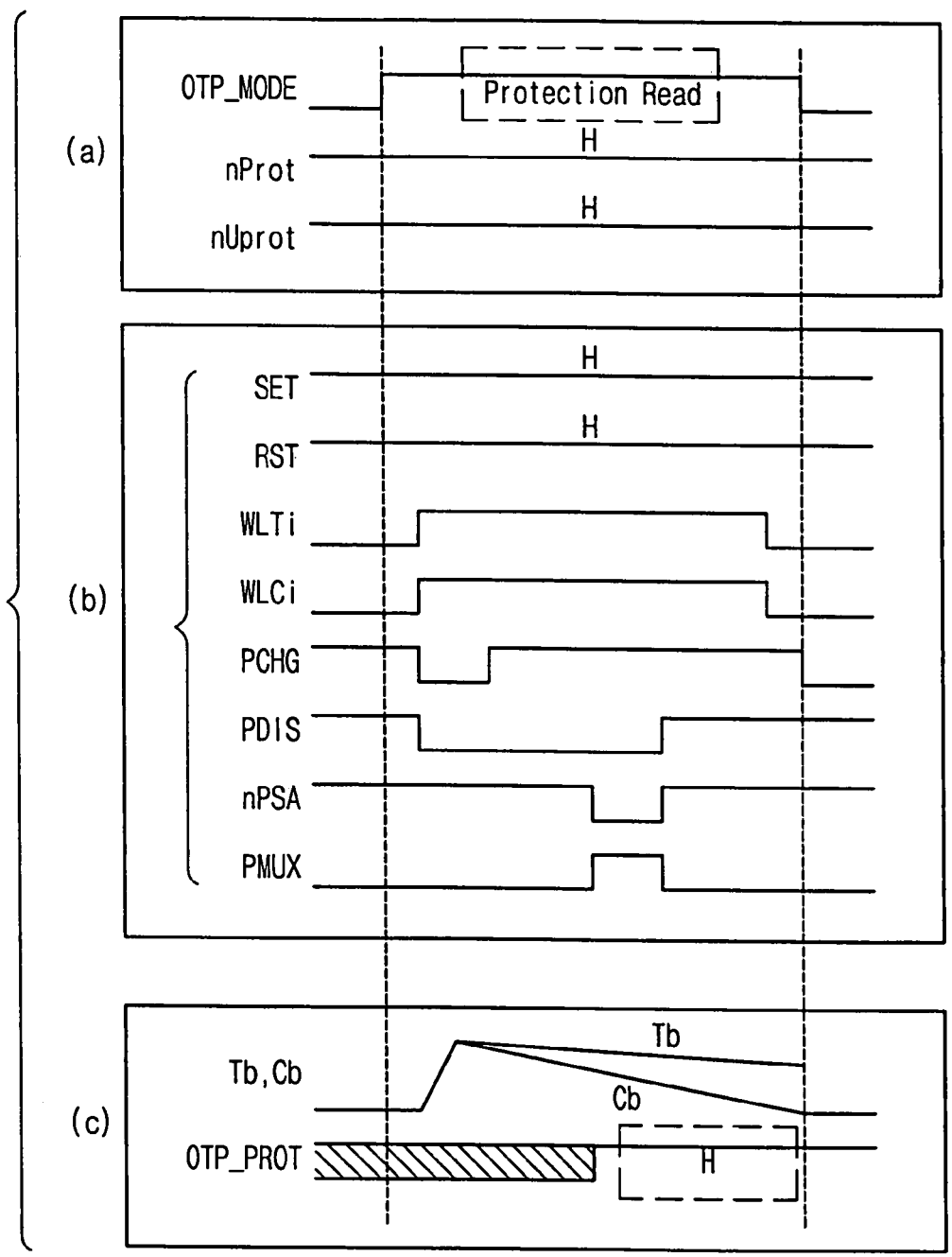

FIG. 9 is a timing diagram for explaining reading of the OTP controller setting in the case where the OTP controller setting is OTP Protect. In this state, the memory cell 521T is in a RESET state, and the memory cell 521C is in a SET state. Referring to FIG. 9, the nProt and nUprot signals and the SET and RESET signals are all HIGH, thus turning off the transistors P21 through P28. In addition, the word lines signals WLT and WLC are HIGH to activate the memory cells 521T and 521C. The control signal PCHG is activated to LOW to pre-charge the sense nodes Ta and Ca coupled to the memory cells 521T and 521C, respectively, and the control signal PDIS is driven LOW to turn off the discharge transistors N31 and N32. In addition, although not shown in FIG. 9, the control signal CLMP is used to clamp the voltage of the sense nodes Ca and Ta within an allowable sensing range. Since the memory cell 521T is in a RESET state and the memory cell 521C is in a SET state, the voltage at node Cb will drop below that at node Tb. Thus, when the control signal nPSA is activated to LOW and the control signal PMUX is activated to HIGH, the OTP protection signal OTP_PROT will be output with a HIGH logic level. As such, the writer driver 600 (FIG. 5) becomes disabled.

Figure 10:
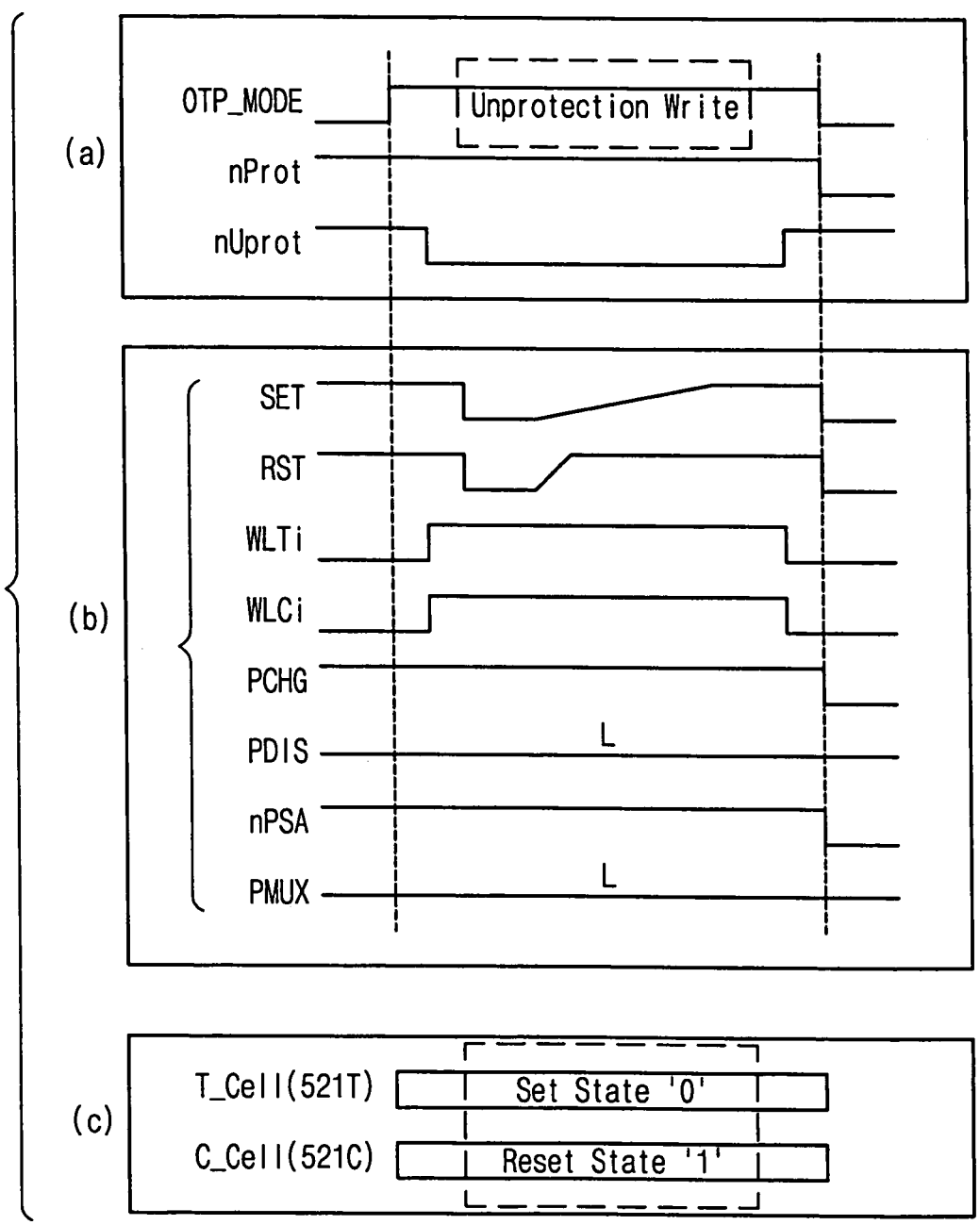

FIG. 10 is a timing diagram for explaining the programming (writing) of the OTP controller setting to OTP Unprotect. As described previously in connection with TABLE 2, this means that the memory cell 521T is programmed to a SET state, and the memory cell 521C is programmed to a RESET state. Initially, the nUprot write signal is driven LOW, while the nProt write signal remains HIGH. As such, transistors P22 and P26 are turned on, and transistors P21 and P25 remain off. Also, word lines WLT and WLC are activated to HIGH, thus turning on the two memory cell transistors MT. The SET and RESET pulses are then applied to the gates of the transistors P24 and P28 to thereby program the memory cells 512T and 512C to the SET and RESET states, respectively. Also, during this OTP Unprotect write operation, the control signals PCHG and nPSA are HIGH, and the control signals PDIS and PMUX are LOW. Thus, the sensing portion 530 and the latch portion 540 are effectively disabled.

Figure 11:
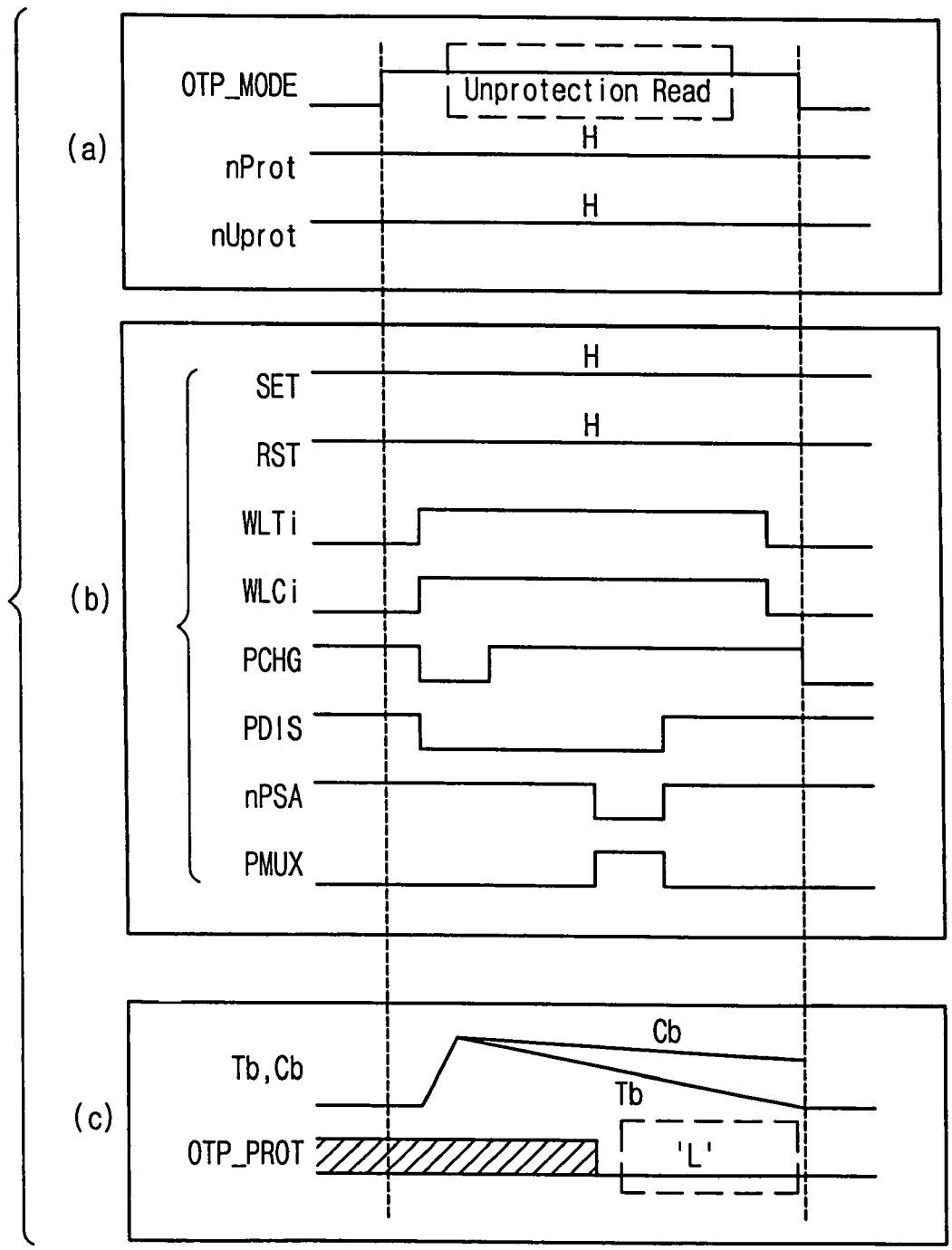

FIG. 11 is a timing diagram for explaining reading of the OTP controller setting in the case where the OTP controller setting is OTP Unprotect. In this state, the memory cell 521T is in a SET state, and the memory cell 521C is in a RESET state. Referring to FIG. 9, the nProt and nUprot signals and the SET and RESET signals are all HIGH, thus turning off the transistors P21 through P28. In addition, the word lines signals WLT and WLC are HIGH to activate the memory cells 521T and 521C. The control signal PCHG is activated to LOW to pre-charge the sense nodes Ta and Ca coupled to the memory cells 521T and 521C, respectively, and the control signal PDIS is driven LOW to turn off the discharge transistors N31 and N32. In addition, although not shown in FIG. 9, the control signal CLMP is used to clamp the voltage of the sense nodes Ca and Ta within an allowable sensing range.

Since the memory cell 521T is in a SET state and the memory cell 521C is in a RESET state, the voltage at node Tb will drop below that at node Cb. Thus, when the control signal nPSA is activated to LOW and the control signal PMUX is activated to HIGH, the OTP protection signal OTP_PROT will be output with a LOW logic level. As such, the writer driver 600 (FIG. 5) remains enabled.

Figure 12:
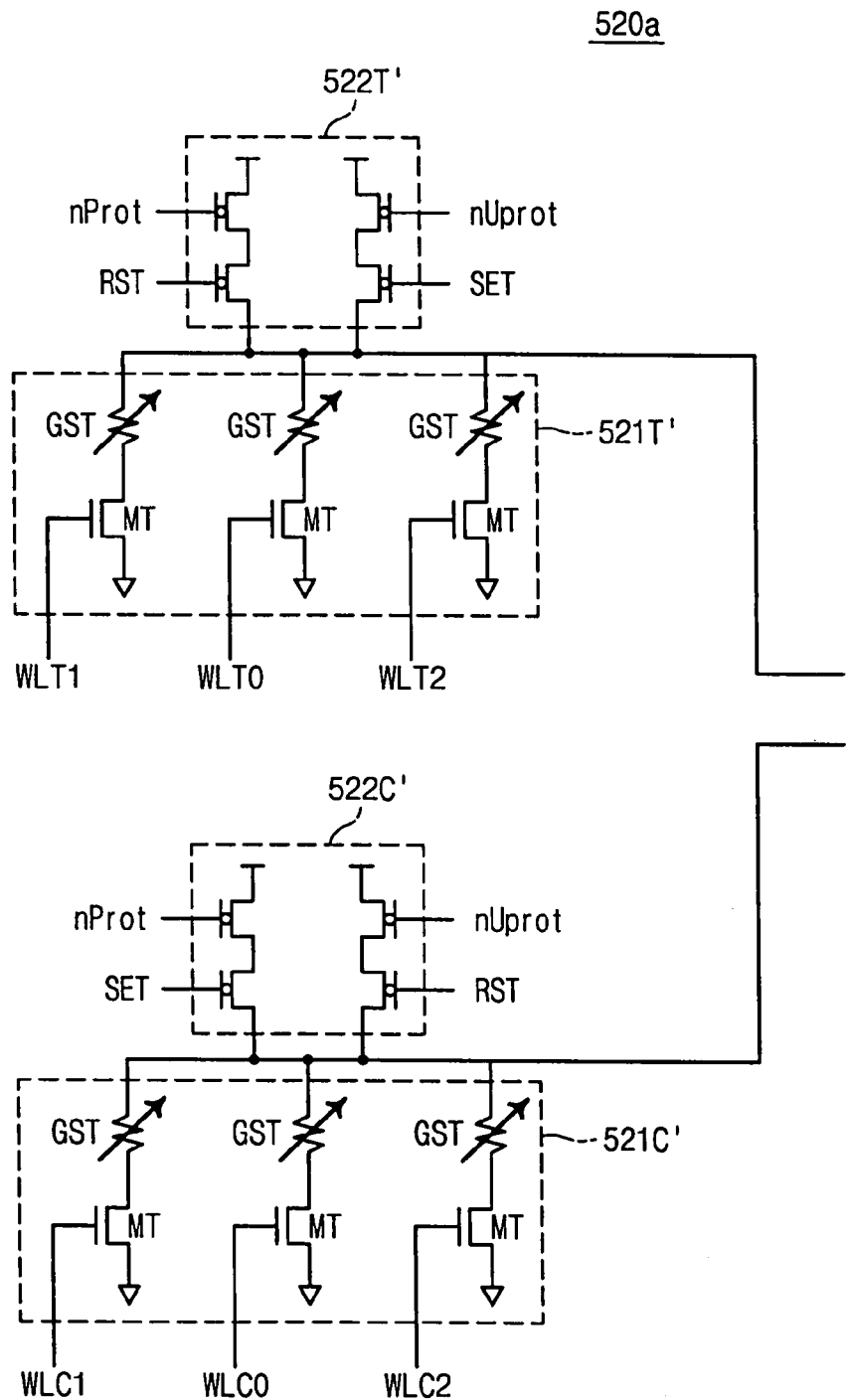
FIGS. 12 and 13 are circuit diagrams of storage portions of OTP protect controllers according to embodiments of the present invention.
Figure 13:
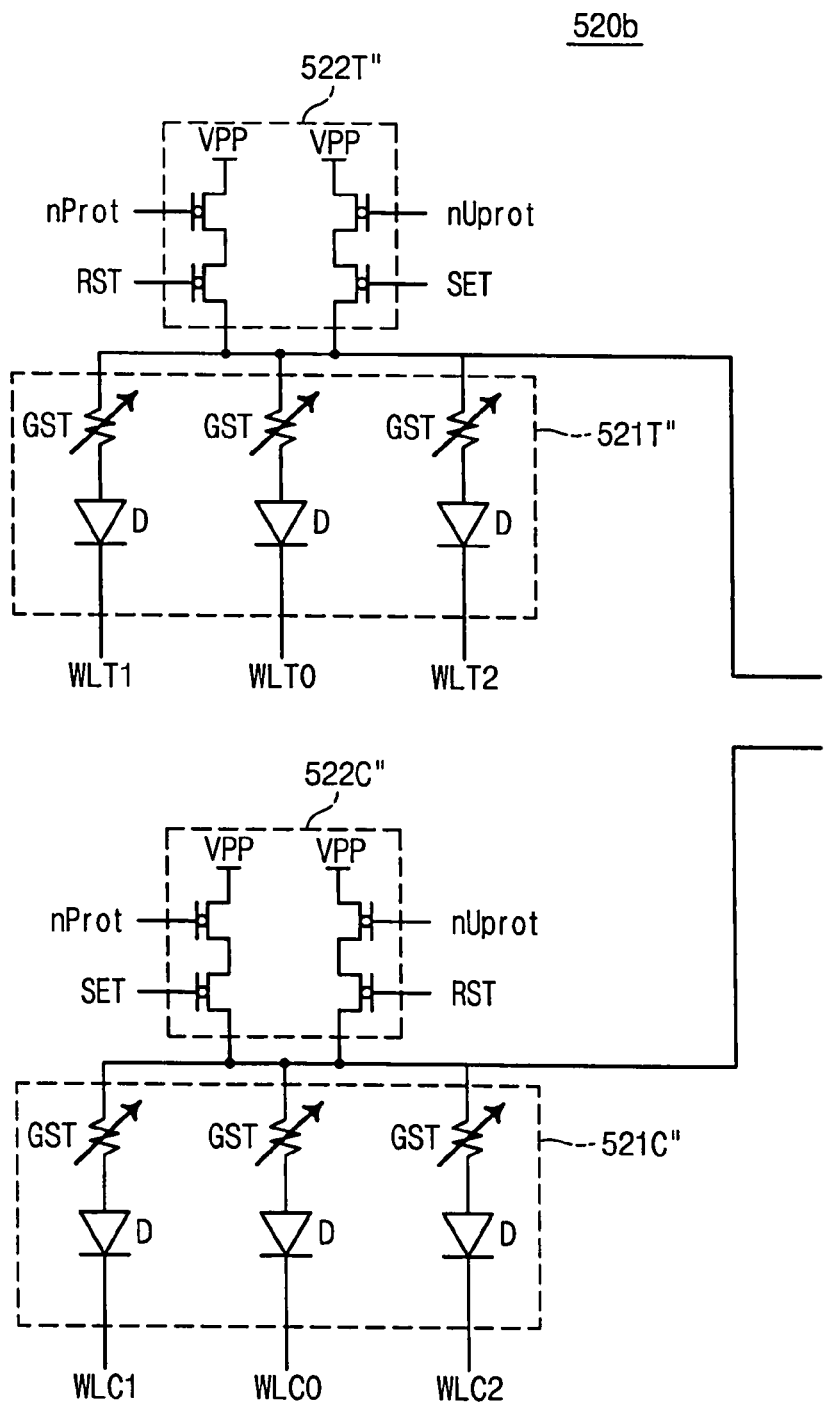

As mentioned previously, the invention is not limited by the memory element or elements used to store the OTP controller setting of the OTP Protect Controller 500. FIG. 12 illustrates one alternative storage portion 520a in which each of complimentary phase-change memory cells 521T' and 521C' are configured of plural (3) parallel phase-change memory elements having NMOS selection transistors (MT) gated to word lines WLT<1:3> and word lines WLC<1:3>, respectively. FIG. 13 illustrates another alternative storage portion 520b in which each of complimentary phase-change memory cells 521T" and 521C" are configured of plural (3) parallel phase-change memory elements having diode (D) selection elements connected to word lines WLT<1:3> and word lines WLC<1:3>, respectively.

Figure 14:
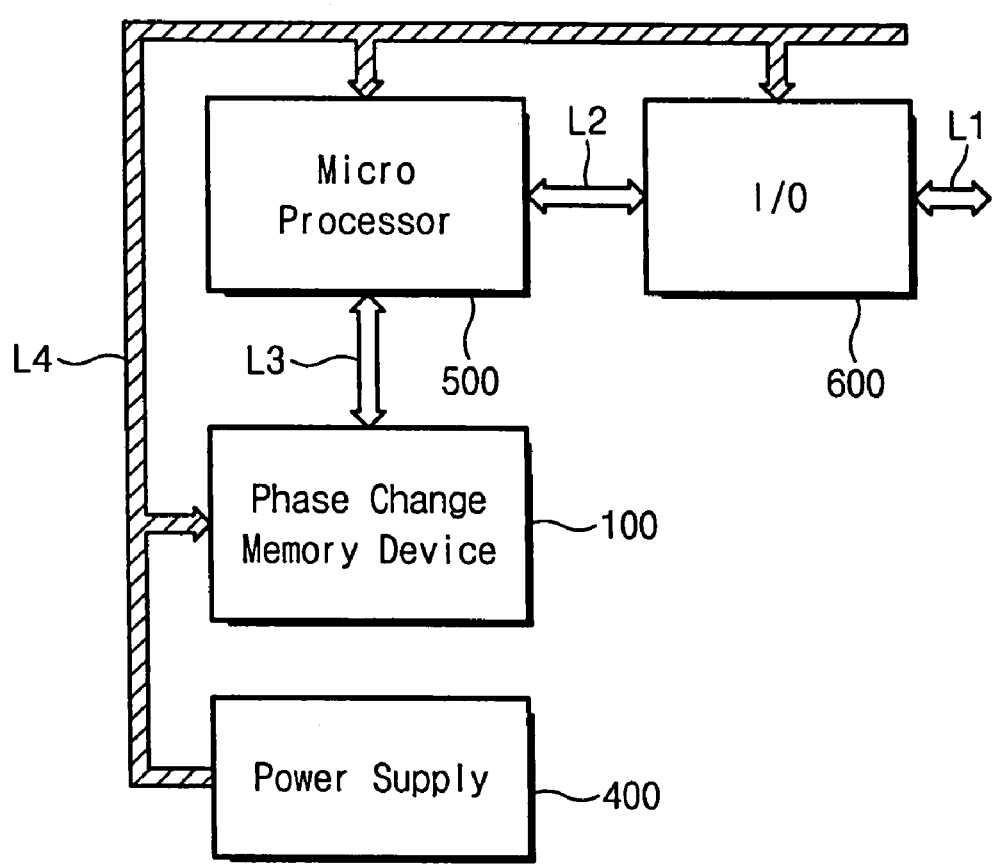
FIG. 14 is a block diagram of a system containing a non-volatile memory according to an embodiment of the present invention.

The phase-change memory devices of the present invention may be utilized, for example, as the non-volatile memory of multiple types of microprocessor driven appliances. FIG. 14 is a simplified block diagram of a system containing a phase-change memory device 1000 of the present invention. The phase-change memory 1000 can function as random access memory of the system, or as a mass storage device of the system, or both. As illustrated, the phase change memory device 1000 is connected to a microprocessor 5000 via one or more data buses L3. The microprocessor 5000 exchanges data over one or more data buses L2 with an I/O interface 6000, and the I/O interface 6000 transmits and receives data over input/output data lines L1. As examples, the input/output data lines L1 may be operatively coupled to a computer peripheral bus, a high speed digital communication transmission line, or an antenna system. A power distribution system L4 supplies power from a power supply 4000 to the phase-change memory device 1000, the microprocessor 5000 and the I/O interface 600.

The system of FIG. 14 may be utilized in both portable and non-portable appliances. In the case of portable appliances, the power supply 4000 will typical contain one or more battery cells. Phase-change memory devices, such as PRAM devices, are particularly suited to battery-powered applications in view of their non-volatile memory characteristics. Non-limiting examples of portable appliances include notebook computers, digital cameras, personal digital assistants (PDA's), and mobile communication devices, such as mobile telephones, mobile email devices, and mobile gaming devices. Non-limiting examples of non-portable appliances include desk-top computers, network servers, and other computing devices typically driven by fixed commercial or residential power systems (such as AC power systems).

In embodiments described above, a phase-change memory cell device is operable in a one-time-programmable (OTP) mode and includes a phase-change cell write driver that is selectively enabled and disabled in the OTP mode. Thus, while the security information can be safely stored in pseudo-OTP memory cells, the security information can also be changed if necessary after initial programming by selectively enabling the write driver during the OTP mode.

Although the present invention has been described above in connection with the preferred embodiments thereof, the present invention is not so limited. Rather, various changes to and modifications of the preferred embodiments will become readily apparent to those of ordinary skill in the art. Accordingly, the present invention is not limited to the preferred embodiments described above. Rather, the true spirit and scope of the invention is defined by the accompanying claims.

What is claimed is:

1. A non-volatile memory comprising:
    a phase-change memory cell array comprising a plurality of normal phase-change memory cells and a plurality of pseudo one-time-programmable (OTP) phase-change memory cells;
    a write driver configured to selectively write data to the normal and pseudo OTP phase-change memory cells of the phase-change memory cell array; and
    an OTP controller configured to selectively disable the write driver to prevent data from being written to the plurality of pseudo OTP phase-change memory cells, and to selectively enable data to be written to at least one of the pseudo OTP phase-change memory cells after an initial programming operation.

2. The non-volatile memory of claim 1, further comprising:
    an address decoder which selectively activates the plurality of OTP phase-change memory cells in response to an OTP mode signal, enabling the data to be written to the at least one of the pseudo OTP phase-change memory cells.

3. The non-volatile memory of claim 2, wherein the OTP controller comprises:
    an OTP mode controller which is responsive to a command signal to output the OTP mode signal; and
    an OTP protect controller which selectively disables the write driver in response to the OTP mode controller.

4. The non-volatile memory of claim 1, wherein the pseudo OTP phase-change memory cells are operatively coupled to an OTP word line which is activated in response to an OTP mode signal.

5. The non-volatile memory of claim 3, wherein the OTP protect controller comprises:
    an OTP controller memory; and
    a sensing circuit which is selectively activated in response to the OTP mode signal to disable the write driver in accordance with a value stored in the OTP controller memory.

6. The non-volatile memory of claim 5, wherein the OTP controller memory comprises at least one phase-change memory cell.

7. The non-volatile memory of claim 5, wherein the OTP controller memory comprises at least two complimentary phase-change memory cells.

8. The non-volatile memory of claim 5, further comprising a write circuit which writes the value in the OTP controller memory.

9. The non-volatile memory of claim 3, wherein the OTP protect controller comprises:
    a storage portion which stores an OTP controller setting;
    a sensing portion which senses the OTP controller setting stored in the storage portion; and
    a latch portion which outputs a control signal according to the OTP controller setting sensed by the sensing portion;
    wherein the write driver is selectively disabled by the control signal output by the latch portion.

10. The non-volatile memory of claim 9, wherein the storage portion comprises at least one phase-change memory cell.

11. The non-volatile memory of claim 9, wherein the storage portion comprises complimentary phase-change memory cells, and write circuits operatively coupled to the phase-change memory cells.

12. A non-volatile memory, comprising:
   a memory cell array comprising a plurality of normal phase-change memory cells operatively coupled to at least one first word line and a plurality of pseudo one-time-programmable (OTP) phase-change memory cells operatively coupled to at least one second word line;
   a write driver which programs the normal and pseudo OTP phase-change memory cells of the memory cell array;
   an OTP mode controller which generates an OTP mode signal; and
   an address decoder which selectively activates the at least one first word line in accordance with an address signal, and which selectively activates the at least one second word line in response to the OTP mode signal, enabling the plurality of pseudo OTP phase-change memory cells to be selectively reprogrammed after an initial programming operation.

13. The non-volatile memory of claim 12, further comprising:
   an OTP protect controller which selectively disables the write driver in response to the OTP mode signal, preventing the plurality of pseudo OTP phase-change memory cells from being reprogrammed after the initial programming operation.

14. The non-volatile semiconductor memory of claim 13, wherein the OTP protect controller comprises:
   an OTP controller memory; and
   a sensing circuit which is selectively activated in response to the OTP mode signal to disable the write driver in accordance with a logic value stored in the OTP controller memory.

15. The non-volatile semiconductor memory of claim 14, wherein the sensing circuit outputs a first signal to disable the write driver when the logic value stored in the OTP controller memory is a first logic value, and a second signal which does not disable the write driver when the logic value stored in the OTP controller memory is a second logic value.

16. The non-volatile semiconductor memory of claim 15, wherein the OTP mode controller further generates a read/write control signal which sets the OTP protect controller to one of read and write modes.

17. The non-volatile semiconductor memory of claim 16, wherein the sensing circuit is disabled when the read/write control signal sets the OTP protect controller to a write mode, and wherein the sensing circuit is enabled when the read/write control signal sets the OTP protect controller to the read mode.

18. The non-volatile memory of claim 17, wherein the OTP controller memory comprises at least one phase-change memory cell.

19. The non-volatile memory of claim 17, wherein the OTP controller memory comprises complimentary first and second phase-change memory cells.

20. The non-volatile memory of claim 19, wherein the OTP controller memory further comprises first and second write circuits which set and reset the complimentary first and second phase-change memory cells, respectively.

21. The non-volatile memory of claim 20, wherein the first write circuit comprises first and second transistors connected in series between a reference potential and the first phase-change memory cell, and third and fourth transistors connected in series between the reference potential and the first phase-change memory cell, and
   wherein the second write circuit comprises fifth and sixth transistors connected in series between the reference potential and the second phase-change memory cell, and seventh and eight transistors connected in series between the reference potential and the second phase-change memory cell.

22. The non-volatile memory of claim 21, wherein write control signals are applied to gates of the first, third, fifth and seventh transistors, wherein a reset pulse signal is applied to the gates of the second and eighth transistors, and wherein a set pulse signal is applied to the gates of the fourth and sixth transistors.

23. The non-volatile memory of claim 20, wherein each of the first and second write circuits is driven by a non-boosted supply voltage.

24. The non-volatile memory of claim 23, wherein each of the first and second phase-change memory cells comprises a phase-change element connected in series with a diode selection element.

25. The non-volatile memory of claim 23, wherein each of the first and second phase-change memory cells comprises a phase-change element connected in series with a MOS transistor selection element.

26. The non-volatile memory of claim 23, wherein the write driver is driven by a boosted supply voltage.

27. A phase-change memory cell device operable in a one-time-programmable (OTP) mode, the phase-change memory cell device comprising:
   a phase-change cell write driver, configured to write data to a plurality of pseudo OTP memory cells only in the OTP mode; and
   a control circuit that selectively enables the phase-change cell write driver during the OTP mode, the phase-change cell write driver writing data to at least one pseudo OTP memory cell after an initial programming operation when enabled, and preventing data to be written to the at least one pseudo OTP memory cell when not enabled.

28. A system comprising a microprocessor connected to a non-volatile memory device, the non-volatile memory comprising:
   a phase-change memory cell array which includes a plurality of normal phase-change memory cells and a plurality of pseudo one-time-programmable (OTP) phase-change memory cells;
   a write driver which selectively writes data to the normal and pseudo OTP phase-change memory cells of the phase-change memory cell array; and
   an OTP controller which selectively disables the write driver to prevent data from being written to the plurality of pseudo OTP phase-change memory cells after an initial programming operation, and which selectively enables data to be written to at least one of the pseudo OTP phase-change memory cells after the initial programming operation.

29. The system of claim 28, further comprising:
   an input/output interface connected to the microprocessor; and
   a power supply which supplies power to the microprocessor, the non-volatile semiconductor memory device, and the input/output interface.

30. The system of claim 29, wherein the system is installed in a mobile communication device.

31. A method of operating a non-volatile semiconductor memory in a one-time-programmable (OTP) mode of operation, comprising:
   accessing pseudo OTP phase-change memory cells after initially programming the pseudo OTP phase-change memory cells; and selectively disabling and enabling programming of the accessed pseudo OTP phase-change memory cells according to a pre-stored OTP control signal.

32. The method of claim 31, wherein the pseudo OTP phase-change memory cells are accessed by activating a word line connected to the OTP phase-change memory cells in response to an OTP mode signal.

33. The method of claim 32, wherein the programming is selectively enabled and disabled by reading the OTP control signal, and enabling or disabling a write driver according to the read OTP control signal.

* * * * *